United States Patent
Weber

(10) Patent No.: US 7,531,020 B2
(45) Date of Patent: May 12, 2009

(54) HEAT SINK MADE FROM DIAMOND-COPPER COMPOSITE MATERIAL CONTAINING BORON, AND METHOD OF PRODUCING A HEAT SINK

(75) Inventor: Ludger Weber, Le Mont sur Lausanne (CH)

(73) Assignees: Plansee SE, Reutte (AU); Ecole Polytechnique Federale de Lausanne, Lausanne (CH)

( * ) Notice: Subject to any disclaimer, the term of this patent is extended or adjusted under 35 U.S.C. 154(b) by 361 days.

(21) Appl. No.: 11/590,613

(22) Filed: Oct. 30, 2006

(65) Prior Publication Data

US 2007/0042895 A1 Feb. 22, 2007

Related U.S. Application Data

(63) Continuation of application No. PCT/AT2005/000126, filed on Apr. 13, 2005.

(30) Foreign Application Priority Data

Apr. 29, 2004 (AT) .............................. GM324/2004

(51) Int. Cl.
  *C22C 1/10* (2006.01)
  *C22C 26/00* (2006.01)
(52) U.S. Cl. .............................. 75/243; 75/244; 419/27
(58) Field of Classification Search ................... 75/243, 75/244; 419/27
  See application file for complete search history.

(56) References Cited

U.S. PATENT DOCUMENTS 3,148,161 A * 9/1964 Wentorf, Jr. et al. ........ 252/502
3,727,667 A * 4/1973 Bell ............................. 164/80
5,499,601 A * 3/1996 Imai et al. ...................... 117/84
5,591,484 A * 1/1997 Poncelet et al. ......... 427/249.11
5,677,372 A * 10/1997 Yamamoto et al. .......... 524/495
5,783,316 A 7/1998 Colella et al.
5,834,115 A 11/1998 Weeks, Jr. et al.
2004/0070071 A1 4/2004 Sung

FOREIGN PATENT DOCUMENTS

| EP | 0 364 155 A2 | 4/1990 |
|---|---|---|
| EP | 0 475 575 A1 | 3/1992 |
| EP | 0 898 310 A2 | 2/1999 |
| EP | 1 160 860 A1 | 12/2001 |
| EP | 1 414 064 A1 | 4/2004 |

* cited by examiner

*Primary Examiner*—Roy King
*Assistant Examiner*—Ngoclan T Mai
(74) *Attorney, Agent, or Firm*—Laurence A. Greenberg; Werner H. Stemer; Ralph E. Locher

(57) ABSTRACT

A heat sink that is particularly suitable for semiconductor components is made from a diamond-containing composite material. In addition to a diamond fraction amounting to 40-90% by volume, the composite material also contains 7 to 59% by volume copper or a copper-rich phase (with Cu>80 at. %) and 0.01 to 20% by volume boron or a boron-rich phase (with B>50 at. %). The bonding of copper to the diamond grains can be considerably improved by the addition of boron, with the result that a high thermal conductivity can be achieved. The heat sink component is preferably produced with an unpressurized and pressure-assisted infiltration technique.

22 Claims, No Drawings

HEAT SINK MADE FROM DIAMOND-COPPER COMPOSITE MATERIAL CONTAINING BORON, AND METHOD OF PRODUCING A HEAT SINK

CROSS-REFERENCE TO RELATED APPLICATIONS

This is a continuing application, under 35 U.S.C. § 120, of copending international application No. PCT/AT2005/000126, filed Apr. 13, 2005, which designated the United States; this application also claims the priority, under 35 U.S.C. § 119, of Austrian patent application GM 324/2004, filed Apr. 29, 2004; the prior applications are herewith incorporated by reference in their entirety.

BACKGROUND OF THE INVENTION

Field of the Invention

The invention relates to a component, namely, a heat sink made from a composite material comprising 40 to 90% by volume of diamond grains and 7 to 59% by volume of copper or a copper-rich solid solution where Cu>80 at. %. Furthermore, the invention also pertains to a method of producing such a component.

Heat sinks are in widespread use in the fabrication of electronic components. In addition to the heat sink, the main constituents of an electronic package are the semiconductor component and a mechanically stable encapsulation. The terms substrate, heat spreader or carrier plate are often also used for the heat sink. The semiconductor component consists, for example, of single-crystal silicon or gallium arsenide. The component is joined to the heat sink, usually by soldering. The heat sink serves to dissipate the heat generated when the semiconductor component is operating. Semiconductor components which produce particularly high levels of heat include, for example, LDMOS (laterally diffused metal oxide semiconductor), laser diodes, CPU (central processing unit), MPU (microprocessor unit), and HFAD (high frequency amplifying device).

The heat sink may assume any of a vast number of different geometric designs according to the particular application. Simple forms include flat plates. However, complicated substrates with recesses and steps are also used. The heat sink itself is in turn connected to a mechanically stable encapsulation.

The coefficients of thermal expansion of the semiconductor materials used are low compared to other materials and are given in the literature as $2.1 \times 10^{-6} K^{-1}$ to $4.1 \times 10^{-6} K^{-1}$ for silicon and $5.6 \times 10^{-6} K^{-1}$ to $5.8 \times 10^{-6} K^{-1}$ for gallium arsenide.

Other semiconductor materials which are not yet in widespread use on a large industrial scale, such as for example Ge, InP or silicon carbide, also have similarly low expansion coefficients. Ceramic materials, material composites or plastics are usually used for the encapsulation.

Examples of ceramic materials include $Al_2O_3$, which has an expansion coefficient of $6.5 \times 10^{-6} K^{-1}$, or aluminum nitride, which has an expansion coefficient of $4.5 \times 10^{-6} K^{-1}$.

If the expansion properties of the components involved differ, stresses occur in the assembly, which can lead to the component becoming distorted, detached or fractured. Stresses may form even during production of the package, specifically during the cooling phase from the soldering temperature to room temperature. However, temperature fluctuations also occur when the package is operating, ranging for example from −50° C. to 200° C., which can lead to thermomechanical stresses in the package.

This results in the demands which are imposed on the material for the heat sink. Firstly, its thermal conductivity should be as great as possible, in order to minimize the rise in the temperature of the semiconductor component during operation. Secondly, it is necessary for the coefficient of thermal expansion to be matched as closely as possible to that of the semiconductor component and also to that of the encapsulation. Single-phase metallic materials do not sufficiently satisfy the required profile of properties, since the materials with a high thermal conductivity also have a high coefficient of thermal expansion.

Therefore, to satisfy the profile of required characteristics, composite materials or material composites are used to produce the substrate.

Standard tungsten-copper and molybdenum-copper composite materials or material composites, as described for example in European patent publication EP 0 100 232, and in U.S. Pat. Nos. 4,950,554 and 5,493,153, have a thermal conductivity at room temperature of 170 to 250 W/(m·K) with a coefficient of thermal expansion of $6.5 \times 10^{-6}$ to $9.0 \times 10^{-6} K^{-1}$, which is no longer adequate for many applications.

Diamond or diamond-containing composite materials or material composites have been the subject of increasing interest in view of the ever greater demands imposed on the thermal conductivity of heat sinks. For example, the thermal conductivity of diamond is 1400 to 2400 W/(m·K), in which context in particular the nitrogen and boron atom content at lattice sites is crucial in determining quality.

European patent publication EP 0 521 405 describes a heat sink which has a polycrystalline diamond layer on the side facing the semiconductor chip. Diamond layers produced by way of CVD (chemical vapor deposition) have a thermal conductivity of 1000 to 1500 W/(m·K). However, cracks can occur in the diamond layer even during cooling from the coating temperature, on account of the lack of plastic deformability of the diamond layer.

U.S. Pat. No. 5,273,790 describes a diamond composite material with a thermal conductivity of >1700 W/(m·K), in which loose, shaped diamond particles are converted into a stable shaped body by way of subsequent vapor deposition of diamond. The diamond composite produced in this way is too expensive for commercial use in mass-produced parts.

Published international patent application WO 99/12866 describes a process for producing a diamond/silicon carbide composite material. It is produced by infiltrating a diamond skeleton with silicon or a silicon alloy. On account of the high melting point of silicon and the resulting high infiltration temperature, diamond is partially converted into carbon and/or then into silicon carbide. On account of the high brittleness, this material is very difficult and expensive to machine.

U.S. Pat. No. 4,902,652 describes a process for producing a sintered diamond material. An element selected from the transition metal groups 4a, 5a and 6a, boron and silicon is deposited on diamond powder by means of physical coating processes. Then, the coated diamond grains are joined to one another by means of a solid-phase sintering process at high pressure. A drawback of this process is that the product which is formed has a high porosity. Moreover, the production process is highly complex.

U.S. Pat. No. 5,045,972 describes a composite material in which, in addition to diamond grains of a size of from 1 to 50 μm, there is also a metallic matrix consisting of aluminum, magnesium, copper, silver or alloys thereof. One drawback of this material is that the metallic matrix is inadequately bonded to the diamond grains, resulting in an insufficient thermal conductivity and mechanical integrity. The use of finer diamond powder, for example with a grain size of <3 μm, as disclosed by U.S. Pat. No. 5,008,737, also fails to improve the diamond/metal bonding, and on account of the larger diamond/metal interface area leads to a significant deterioration in the thermal conductivity.

U.S. Pat. No. 5,783,316 describes a process in which diamond grains are coated with W, Zr, Re, Cr or titanium, then the coated grains are compacted and the porous body is infiltrated for example with Cu, Ag or Cu—Ag melts. The high coating costs restrict the fields for which composite materials produced in this way can be used.

European patent publication 0 859 408 describes a material for heat sinks, the matrix of which is formed from diamond grains and metal carbides, the matrix spaces being filled by a metal. Metal carbides referred to are the carbides of the metals from groups 4a to 6a of the periodic system. The description in EP 0 859 408 lays particular emphasis in this context on TiC, ZrC and HfC. Ag, Cu, Au and Al are listed as particularly advantageous filler metals. The transition metals from groups 4a to 6a are all strongly carbide-forming elements. Consequently, the carbide layers formed are relatively thick. This combined with the low thermal conductivity of these carbides (10-65 W/m·K) reduces the thermal conductivity boosting effect of the diamond phase considerably.

If a diamond skeleton is infiltrated with an alloy that contains a strong carbide-forming element, excess carbide is formed in the zones close to the surface, resulting in the infiltration material becoming depleted of the carbide-forming element and in subsequent inadequate bonding of the metal to the diamond in the interior. This leads firstly to inhomogeneous materials and secondly also to a deterioration in the infiltration process caused by a drop in the open porosity.

Although the abovementioned depletion can be attenuated by increasing the concentration of carbide-forming elements, thereby improving the bonding in the interior, this entails the risk of residues of the carbide-forming element remaining in solid solution for kinetic reasons, which has a highly deleterious effect on the thermal conductivity of the metal phase.

European patent publication 0 898 310 describes a heat sink which consists of diamond grains, a metal or metal alloy with a high thermal conductivity selected from the group consisting of Cu, Ag, Au, Al, Mg and Zn, and a metal carbide of the metals from groups 4a, 5a and Cr, with the metal carbides covering at least 25% of the surface of the diamond grains. In this case too, the poor thermal conductivity of the carbides of groups 4a, 5a of the periodic system and Cr, the high infinity of these elements for carbon and the in some cases significant solubility in Cu, Ag, Au, Al and Mg have an adverse effect.

In recent years, process speeds and the degree of integration in semiconductor components have risen considerably, which has also led to an increase in the levels of heat generated in the package. Therefore, optimum heat management represents an evermore important criterion. The thermal conductivity of the materials described above is no longer sufficient for many applications, or alternatively these materials are too expensive to produce for widespread use. The availability of improved, inexpensive heat sinks is therefore a precondition for further optimization of semiconductor devices.

SUMMARY OF THE INVENTION

It is accordingly an object of the invention to provide a composite material for a heat sink component and a corresponding manufacturing method which overcome the abovementioned disadvantages of the heretofore-known materials, devices, and methods of this general type and which provide for a material with a high thermal conductivity and a low expansion coefficient, combined with processing properties that allow inexpensive production.

With the foregoing and other objects in view there is provided, in accordance with the invention, a component formed as a heat sink of a composite material. The composite material comprises: 40 to 90% by volume diamond grains; 7 to 59% by volume copper or a copper-rich solid solution with Cu>80 at. %; and 0.01 to 20% by volume boron or a boron-rich phase with B>50 at. %.

The component according to the invention has an excellent bonding strength between the diamond grains and the copper-rich phase. Boron enrichment in the atomic layer range through to the formation of a boron-carbon compound at the interfaces between the diamond grains and the copper-rich phase, depending on the boron content and the production parameters, can be recorded by means of high-resolution measurement methods. The thickness of the boron-carbon compound is preferably in the range from 1 nm (corresponding to a boron-carbon compound content by volume of approximately 0.001%) to 10 μm, preferably up to 0.05 μm. Even incomplete coverage of the diamond grains is sufficient to achieve enough bonding.

It is also possible for atoms of other elements to be included in the boron-carbon compound.

Boron-carbon compounds have a sufficiently high thermal conductivity (e.g. $B_4C$ approx. 40 W/(mK)).

Since boron is a relatively weakly carbide-forming agent, the carbide-forming element is not depleted too quickly in the copper melt during an infiltration process, with the result that a highly homogeneous material can be achieved. Moreover, the carbide layers which form are in relative terms very thin, which is likewise of benefit to the thermal conductivity. Since in the solid state the solubility of boron in copper is very low (between 0.005 and 0.3 at. %, depending on the cooling rate), the thermal conductivity of the copper matrix deteriorates only slightly. Boron is present in precipitated form in the copper matrix, forming between 0.01 and 20% by volume. Boron-rich compounds with a boron content of >50 at. % may also precipitate, depending on further alloying elements in the copper. Further microstructure constituents, such as for example amorphous carbon, do not have an unacceptably adverse effect on the properties, provided that they do not exceed 10% by volume and the thermal conductivity of these microstructural constituents exceeds 50 W/(mK). The crucial factor in this context is always that the copper matrix should as far as possible remain free of foreign atoms, or dissolved fractions should have the minimum possible negative influence on the thermal conductivity, as is the case with Cu—Ag or Cu—Zn.

The machining properties are sufficient, on account of the highly ductile copper-containing microstructural constituents. A further advantage for inexpensive production is that on account of the high thermal conductivity of the copper-containing microstructural constituents, the diamond content can be reduced compared for example to diamond-SiC materials. By varying the diamond, copper and boron contents, it is possible to produce heat sinks with a thermal conductivity and thermal expansion which has been tailored to a very wide range of requirements.

Particularly advantageous boron carbide and copper or copper-rich phase contents are 0.005 to 1% by volume and 15 to 40% by volume, respectively.

Tests have shown that diamond powders can be processed within a wide grain size range. In addition to natural diamonds, it is also possible to process less expensive synthetic diamonds. Therefore, it is possible to in each case use the least expensive grade. For applications in which cost is not the critical factor and which impose extremely high demands on the thermal conductivity, it is expedient to use a diamond fraction with a mean grain size in the range from 50 to 300 µm, preferably 100 to 200 µm. High diamond grain packing densities can be achieved by the use of powders with a bimodal particle size distribution. It is advantageous if the first distribution maximum is 20 to 40 µm and the second distribution maximum is 130 to 250 µm.

For the components to be used as heat sinks for electronic components, it is advantageous for them to be coated with Ni, Cu, Au or Ag or an alloy of these metals and then to be soldered to a ceramic frame, for example made from $Al_2O_3$ or AlN.

With the above and other objects in view, there is also provided a method of producing a heat sink component, the method which comprises:

providing an intermediate material containing diamond grains with a mean grain size of 50 to 300 µm and an optional component of a Cu—B alloy and/or a binder;

shaping the intermediate material in an unpressurized or pressure-assisted shaping process, wherein a diamond fraction, based on a total volume of the intermediate material, amounts to 40 to 90% following the shaping step;

heating, with an unpressurized or pressure-assisted heating process, the intermediate material and an infiltrate alloy containing Cu and B to a temperature above a liquidus temperature of the infiltrate alloy but below 1100° C., and causing the infiltrate alloy to infiltrate the intermediate material, and filling at least 97% of pore spaces in the intermediate material.

In accordance with an alternative embodiment of the invention, there is provided a method of producing a heat sink component which comprises:

providing an intermediate material with diamond grains and an infiltrate alloy containing Cu and B, and mixing or milling the intermediate material;

filling a die of a hot press with the intermediate material, heating to a temperature T, where 500° C.<T<1100° C., and hot-pressing the intermediate material.

In the context, eutectic or near-eutectic Cu—B alloys are used for the infiltration. Near-eutectic alloys comprise alloys with a liquidus temperature of <1050° C.

A wide range of processes can be used for production. For example, it is possible for diamond powder to be compacted with a copper-boron alloy under temperature and pressure. This can take place for example in hot presses or hot isostatic presses. In principle, it is also possible for copper and boron to be introduced separately. In this case, the alloy is formed during the hot-pressing operation. The starting point in this case may also be $B_4C$-coated or boron-coated diamond powder. Infiltration has proven particularly advantageous. This involves producing a precursor or intermediate material, which in addition to diamond powder may also contain a binder. In this context, binders which are largely pyrolyzed under the action of heat are particularly advantageous. Advantageous binder contents are from 1 to 20% by weight. Diamond powder and binder are mixed in standard mixers or mills. This is followed by the shaping, which can take place by introducing a bed into a mold or with the assistance of pressure, for example by pressing or metal injection molding. The intermediate material is subsequently heated to a temperature at which the binder is at least partially pyrolyzed. However, the pyrolysis of the binder can also take place during the heating in the infiltration process. The infiltration process may take place in unpressurized or pressure-assisted form. The latter option can be implemented by squeeze casting, die casting or in a sinter-HIP installation. The infiltration material used is advantageously a foil made from a copper-boron alloy with a boron content of 1 to 4% by weight. In this case, it is also possible for the alloy formation to take place in situ during the infiltration process. When selecting the composition, it is necessary to take account of the fact that the liquidus temperature of the respective alloy should not be higher than 1200° C., advantageously no higher than 1050° C., since otherwise excessively high levels of diamond fraction decompose. Foils with a eutectic or near-eutectic composition, in which context near-eutectic compositions encompass alloys with a liquidus temperature of <1050° C., are particularly suitable for the infiltration. In addition to the particularly advantageous use of the components for the dissipation of heat from semiconductor components, the composite material according to the invention can also be used as a heat sink in other application areas, such as for example in aeronautical or aerospace applications or motor manufacture.

Other features which are considered as characteristic for the invention are set forth in the appended claims.

Although the invention is described herein as embodied in heat sink made from diamond-copper composite material containing boron, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of two specific, exemplary embodiments of the invention.

DESCRIPTION OF THE PREFERRED EMBODIMENTS

The invention will now be explained in more detail below by way of two production examples.

Example 1

Diamond powder with a size of 90-104 µm (mesh 140-170) was introduced into an aluminum oxide crucible and compacted by vibration. A cylindrical piece of a near-eutectic Cu—2.5% by weight boron alloy was placed onto the diamond bed. The crucible containing diamond and alloy was placed into an induction-heatable cylindrical space inside a pressure vessel. After a primary vacuum had been reached, the batch was heated to 1080° C. and left at the final temperature for 15 minutes. Then, a gas pressure of 50 bar ($5 \times 10^6$ Pa) was set in the pressure vessel and the heating was switched off. The Cu—B-diamond composite material resulting from this operation had a thermal conductivity of 540 W/(mK), combined with a coefficient of thermal expansion of $6.6 \times 10^{-6} K^{-1}$.

Example 2

Diamond powder of a size of 180-215 (mesh 70-80) was, as described in Example 1, infiltrated with a near-eutectic Cu—2.5% by weight B alloy, but this time at only 5 bar gas pressure. The Cu—B-diamond composite material resulting from this operation had a thermal conductivity of 620 W/(mK), combined with a coefficient of thermal expansion of $6.9 \times 10^{-6} K^{-1}$.

I claim:

1. A heat sink component formed of a composite material, the composite material comprising:
   40 to 90% by volume diamond grains;
   7 to 59% by volume copper or a copper-rich solid solution with Cu>80 at. %; and
   0.01 to 20% by volume boron or a boron-rich phase with B>50 at. %.

2. The component according to claim 1, wherein the copper-rich solid solution contains 0.005 to 0.3 at. % boron.

3. The component according to claim 1, wherein the composite material contains 0.001 to 5% by volume of a boron-carbon compound.

4. The component according to claim 3, wherein said boron-carbon compound is formed predominantly or exclusively by reacting boron with carbon of said diamond grains.

5. The component according to claim 3, wherein said boron-carbon compound is disposed as a layer covering at least 60% of a surface of said diamond grains.

6. The component according to claim 5, wherein a thickness of said boron-carbon layer is 1 to 50 nm.

7. The component according to claim 1, wherein said copper solid solution contains 0.01 to 5 at. % silver.

8. The component according to claim 1, which further comprises 0.01 to 10% by volume of a silver-rich phase.

9. The component according to claim 1, which comprises 0.01 to 5% by volume of unbonded, amorphous carbon.

10. The component according to claim 1, wherein a mean diamond grain size of said diamond grains is 50 to 300 µm.

11. The component according to claim 10, wherein the mean diamond grain size is 100 to 200 µm.

12. The component according to claim 1, wherein said diamond grains have a defined grain size with a bimodal distribution, including a first distribution maximum at 20-40 µm and a second distribution maximum at 130-250 µm.

13. The component according to claim 1, which comprises 0.005 to 1% by volume of a boron-carbon compound.

14. The component according to claim 1, which comprises 15 to 40% by volume copper or a copper-rich solid solution with Cu>90 at. %.

15. The component according to claim 1, which comprises 0.2 to 10% by volume boron or a boron-rich phase with B>90 at. %.

16. A heat sink component formed of the material according to claim 1 and having a metallic coating applied thereto, said metallic coating comprising a material selected from the group consisting of Ni, Cu, Au, Ag, and an alloy thereof.

17. A heat sink component formed of the material according to claim 1 and having a ceramic frame soldered thereonto.

18. A method of producing a heat sink component, the method which comprises:
   providing an intermediate material containing diamond grains with a mean grain size of 50 to 300 µm and an optional component of a Cu—B alloy and/or a binder;
   shaping the intermediate material in an unpressurized or pressure-assisted shaping process, wherein a diamond fraction, based on a total volume of the intermediate material, amounts to 40 to 90% following the shaping step;
   heating, with an unpressurized or pressure-assisted heating process, the intermediate material and an infiltrate alloy containing Cu and B to a temperature above a liquidus temperature of the infiltrate alloy but below 1100° C., and causing the infiltrate alloy to infiltrate the intermediate material, and filling at least 97% of pore spaces in the intermediate material.

19. The method according to claim 18, which comprises providing a eutectic or near-eutectic Cu—B alloy for the infiltration, wherein near-eutectic alloys comprise alloys with a liquidus temperature of <1050° C.

20. A method of producing a heat sink component, the method which comprises:
   providing an intermediate material with diamond grains and an infiltrate alloy containing Cu and B, and mixing or milling the intermediate material;
   filling a die of a hot press with the intermediate material, heating to a temperature T, where 500° C.<T<1100° C., and hot-pressing the intermediate material.

21. The method according to claim 20, which comprises providing a eutectic or near-eutectic Cu—B alloy for the infiltration, wherein near-eutectic alloys comprise alloys with a liquidus temperature of <1050° C.

22. The heat sink component according to claim 1 configured as a heat sink for one or more semiconductor components.

* * * * *